United States Patent [19]
Witherspoon et al.

[11] Patent Number: 5,935,461
[45] Date of Patent: Aug. 10, 1999

[54] PULSED HIGH ENERGY SYNTHESIS OF FINE METAL POWDERS

[75] Inventors: F. Douglas Witherspoon, Fairfax Station; Dennis W. Massey, Manassas, both of Va.

[73] Assignee: Utron Inc., Manassas, Va.

[21] Appl. No.: 08/900,842

[22] Filed: Jul. 25, 1997

Related U.S. Application Data

[60] Provisional application No. 60/022,643, Jul. 25, 1996.

[51] Int. Cl.⁶ .................................................. B23K 10/00
[52] U.S. Cl. ................................. 219/121.59; 219/76.16; 219/121.52; 219/121.43; 75/338; 75/346; 427/569; 427/565
[58] Field of Search .......................... 219/121.47, 121.52, 219/121.54, 121.57, 76.15, 121.43, 76.16, 121.59; 427/569, 565, 535; 75/330, 338, 346

[56] References Cited

U.S. PATENT DOCUMENTS

| | | |
|---|---|---|
| 3,212,914 | 10/1965 | Lyle et al. . |
| 3,312,566 | 4/1967 | Winzeler et al. ................... 219/121.47 |
| 4,142,089 | 2/1979 | Lau et al. . |
| 4,370,538 | 1/1983 | Browning ........................... 219/121.59 |
| 4,374,075 | 2/1983 | Yolton et al. . |
| 4,592,781 | 6/1986 | Cheney et al. . |
| 4,689,463 | 8/1987 | Shubert . |
| 4,715,261 | 12/1987 | Goldstein et al. . |
| 4,788,402 | 11/1988 | Browning .............................. 219/76.16 |
| 4,821,508 | 4/1989 | Burton et al. . |
| 4,821,509 | 4/1989 | Burton et al. . |
| 4,974,487 | 12/1990 | Goldstein et al. . |
| 5,206,059 | 4/1993 | Marantz . |
| 5,262,206 | 11/1993 | Rangaswamy et al. . |
| 5,296,667 | 3/1994 | Marantz et al. ................... 219/121.47 |
| 5,425,231 | 6/1995 | Burton . |
| 5,442,153 | 8/1995 | Marantz et al. . |

FOREIGN PATENT DOCUMENTS

| | | |
|---|---|---|
| 0232594 | 11/1986 | European Pat. Off. . |

OTHER PUBLICATIONS

Witherspoon, F.D., et al., "High Velocity Pulsed Wire–Arc Spray," Final Report, NASA Contract NAS8–40694, Jul. 10, 1996.

Fleischer, D. "Ceramic Insulators for Pulsed Electrothermal Discharges," Final Report, DNA Contract No. DAN001–86–C–0072, Jan. 30, 1987.

(List continued on next page.)

*Primary Examiner*—Mark Paschall
*Attorney, Agent, or Firm*—James Creighton Wray; Meera P. Narasimhan

[57] ABSTRACT

Repetitively pulsed plasma jets generated by a capillary arc discharge at high stagnation pressure (>15,000 psi) and high temperature (>10,000 K) are utilized to produce 0.1–10 μm sized metal powders and decrease cost of production. The plasma jets impact and atomize melt materials to form the fine powders. The melt can originate from a conventional melt stream or from a pulsed arc between two electrodes. Gas streams used in conventional gas atomization are replaced with much higher momentum flux plasma jets. Delivering strong incident shocks aids in primary disintegration of the molten material. A series of short duration, high pressure plasma pulses fragment the molten material. The pulses introduce sharp velocity gradients in the molten material which disintegrates into fine particles. The plasma pulses have peak pressures of approximately one kilobar. The high pressures improve the efficiency of disintegration. High gas flow velocities and pressures are achieved without reduction in gas density. Repetitively pulsed plasma jets will produce powders with lower mean size and narrower size distribution than conventional atomization techniques.

33 Claims, 12 Drawing Sheets

OTHER PUBLICATIONS

Burton, R.L., et al., "Ceramic Insulators for Pulsed Electrothermal Devices," Final Report, NASA Contract No. NAS 3–25272, May 25, 1989.

Kear, B., "Advanced Metals," Scientific American, pp. 159–167, Oct. 1986.

White, D.G., "Powder Metallurgy in 1995," Advanced Materials & Processes, pp. 49–51, Aug. 1995.

Steinberg, M.A., "Materials for Aerospace," Scientific American, pp. 67–72, Oct. 1986.

Ayers, J.D., et al., "Very Fine Metal Powders," Journal of Metals, vol. 37, No. 8, pp. 16–21, Aug. 1985.

Lawley, A., "Atomization: The Production of Metal Powders," Metal Powder Industries Federation, Princeton, NJ, 1992.

Erickson, A.R., et al., "Injection Molding," Metals Handbook, 9th ed., vol. 7, American Society for Metals, Metals Park, OH, pp. 495–500, 1984.

Ayers, J.D., "Fine Particles," The Elliott Symposium, Iron & Steel Society, Inc., Warrendale, PA, pp. 273–299, 1991.

Cheney, R.F., et al., "The Production of Rapidly Solidified Ultrafine Metal and Ceramic Powders," The Metallurgical Society, pp. 297–308, Warrendale, PA, 1989.

Anderson, I.E., et al., "Flow Mechanisms in High Pressure Gas Atomization," Materials Science & Engineering, vol. A148, pp. 101–114, 1991.

Cooper, K.P., et al., "Counter Rotating Fluid Atomization," Int. J. of Powder Metallurgy, vol. 29, No. 3, pp. 215–226, 1994.

Cooper, K.P., et al., Evaluation of Atomization by the Rapidly Spinning Cup Process, Int. J. of Powder Metallurgy, vol. 30, No. 1, pp. 77–89, '94.

Witherspoon, F.D., et al., "Life Cycle Testing of a Liquid Propellant Radiation–Cooled Pulsed Electrothermal (PET) Thruster," Final Technical Report, NASA Contract NAS 3–25649, Nov. 13, 1992.

Rizkalla, O.F., "High–Pressure Hypervelocity Electrothermal Wind–Tunnel Performance Study & Subscale Tests," J. of Propulsion & Power, vol. 9, No. 5, pp. 731–738, Sep.–Oct. 1993.

Witherspoon, F.D., et al., "Mach 10 to 20 Electrothermal Wind Tunnel Feasibility Study & Demonstration," Final Report, vol. II, GASL TR 342, Nov. 1991.

Goldstein, S.A., et al., "Electric Cartridge Guns Using Fluids Heated by A Capillary Plasma Jet," GT–Devices Report 83–11, Sep. 1983.

Burton, R.L., et al., "EMET Technology for Rail Launchers," IEEE Trans. on Magnetics, vol. MAG–22, No. 6, Nov. 1986.

Burton, R.L., et al., "Mass Acceleration in a Multi–Module Plasma Jet for Impact Fusion," Final Report, May 21, 1984–May 21, 1985, DE–AC08–84DP40202.

McGraw–Hill Encyclopedia of Science & Tech., 6th Ed., vol. 2, pp. 214–218, McGraw–Hill Book Co., 1987.

Hinze, J.O., "Fundamentals of the Hydrodynamic Mechanism of Splitting in Dispersion Process," A.I.Ch.E. Journal, vol. 1, No. 3, pp. 289–295, 9/55.

See, J.B., et al., "Interactions Between Nitrogen Jets & Liquid Lead & Tin Streams," Powder Tech., vol. 21, pp. 119–133, 1978.

Yule, A.J., et al., "Atomization of Melts—For Powder Production & Spray Deposition," Oxford Univ. Press, New York, NY, 1994.

Burton, R.L., et al., Energy–Mass Coupling in High–Pressure Liquid–Injected Arcs, IEEE Transactions on Plasma Science, vol. 19, No. 2, pp. 340–349, Apr. 1991.

Witherspoon, F.D., et al., "High Velocity Pulsed Plasma Thermal Spray," Final Report, BMDO Contract DNA001–95–C–0140, Feb. 26, 1996.

H. Herman, "Plasma–sprayed Coatings," Scientific American, pp. 112–117, Sep. 1988.

Burton, R.L., et al., "Experiments on a Repetitively Pulsed Electrothermal Thruster," J. Propulsion and Power, vol. 6, No. 2, p. 139, 1990.

Marantz, David R., et al., "State of the Art Arc Spray Technology," NTSC Proceedings, pp. 113–118, May 1990.

Steffens, H.–D., et al., "Recent Developments in Arc Spraying," IEEE Transactions on Plasma Science, vol. 18, No. 6, Dec. 1990.

Steffens, H.D., et al., "One Wire Vacuum Arc Spraying—A New Modified Process," NTSC Proceedings, pp. 395–398, May 1991.

Marantz, D.R., et al., "Wire–Arc Plasma Spray Process—Basic Principles and Its Versatility," NTSC Proceedings, pp. 381–387, May 1991.

Longo, F.N., "Industrial Guide–Markets, Materials, and Applications for Thermal–Sprayed Coatings," Journal of Thermal Spray Tech., vol. 1(2), pp. 143–145, Jun. 1992.

Berndt, C.C., et al., "Current Problems in Plasma Spray Processing," Journal of Thermal Spray Technology, vol. 1(4), pp. 341–356, Dec. 1992.

Sampson, E.R., "The Economics of Arc. vs. Plasma Spray for Aircraft Components," NTSC Proceedings, Jun. 1993.

Byrnes, L., et al., "Method and Apparatus for the Application of Thermal spray Coatings onto Aluminum Engine Cylinder Bores," NTSC Proceedings, Jun. 1994.

Scholl, M., "Plasma Spraying with Wire Feedstock," NTSC Proceedings, pp. 491–496, Jun. 1994.

Steffens, H.–D., et al., "The Sonarc Process: Combining the Advantages of Arc and HVOF Spraying," Journal of Thermal Spray, vol. 3(4), pp. 398–403, Dec. 1994.

Steffens, H.–D., et al., "Recent Developments in Single–Wire Vacuum Arc Spraying," Journal of Thermal Spray, vol. 3(4), pp. 412–417, Dec. 1994.

Shcolnikov, E.Ya., et al., "Acceleration of Powder Materials in an Electrothermal Launcher," IEEE Transactions on Magnetics, vol. 31, No. pp. 758–763, Jan. 1995.

Neiser, R.A., et al., "Wire Melting and Droplet Atomization in a HVOF Jet," NTSC Proceedings, pp. 99–104, Sep. 1995.

Meyer, W.B., "Metal Spraying in the U.S.: A JTST Historical Paper," Journal of Thermal Spray, vol. 5(1), pp. 79–83, Mar. 1996.

Kowalsky, K.A., et al., "Characterization of Coatings Produced by the Wire–Arc–Plasma Spray Process", NTSC Proceedings, pp. 389–394, May 199.

PULSED HIGH ENERGY SYNTHESIS OF FINE METAL POWDERS

This application claims the benefit of U.S. Provisional Application No. 60/022,643 filed Jul. 25, 1996.

This invention was made with Government support under Contract No. NAS8-40694 awarded by NASA. The Government has certain rights in this invention.

This invention was made with Government support under Contract DASG60-96-C-0132 awarded by the Ballistic Missile Defense Organization. The Government has certain rights in this invention.

BACKGROUND OF THE INVENTION

Demand for micrometer size metal powders is increasing rapidly as new technologies emerge which can make use of their unique characteristics. One rapidly growing application requiring such powders is metal injection molding, a powder metallurgy process for forming near-net-shape components with higher dimensional accuracy than earlier processes. This application and others, such as electronic circuits made with conductive inks, would be growing even faster if there were economically priced powders of fine size available. A significant need also exists for micrometer size soft magnetic alloy powders for use in low mass radar absorption coatings.

Even with conventional powder metallurgy, the speed at which products are sintered is increased as powder dimensions are reduced, and the sintering temperature is reduced, leading to faster, cheaper manufacturing. The finer microstructure which results can also improve the physical properties of parts made from the finer powders.

SUMMARY OF THE INVENTION

The invention provides a new and innovative approach to producing fine metal powders in the size range of 0.1–10 $\mu$m, decreasing costs of production. This process uses a repetitively pulsed plasma jet generated by a capillary arc discharge at high stagnation pressure (>15,000 psi) and high temperature (>10,000K). These plasma jets can be used in a variety of ways to atomize melt materials and form powders.

The basic principle of gas atomization is straightforward. Breakup is a result of more than one mechanism, but in general it is a process in which the stabilizing influence of surface tension is disrupted by an external force, namely high velocity gas flow. Breakup is caused primarily by instabilities caused by a light fluid pushing against a heavier fluid, and partly by viscous forces which tend to distort the outer periphery of the molten droplet.

The kinetics of all atomization processes typically involve several steps. The extension of the bulk liquid (e.g. molten metal) into sheets, jets, films, or streams is caused by accelerating the liquid in some prescribed manner. This includes the use of pressurized nozzles, simple gravity feed through an orifice, or off a rotating disk. Initiation of small disturbances at the liquid surface forms localized ripples, protuberances, or waves. Formation of short ligaments on the liquid surface results from fluid pressure or shear forces. Collapse of the ligaments into drops results from surface tension in the liquid. Further breakup of the liquid drops as they move through the ambient gaseous medium occurs by the action of fluid pressure or shear forces.

Droplet breakup and atomization is essentially a competition between external dynamic pressure and viscous shear forces which tend to tear the drop apart, and the surface tension and internal viscous forces which tend to resist deformation and breakup. The total amount of energy required increases rapidly as the mean particle size decreases (i.e. as the total surface area increases). Breakup and atomization of liquid droplets is ultimately governed by how efficiently energy from the atomizing fluid can be coupled into the molten metal generating fine isolated particles.

A widely used model for the breakup process pictures a drop of liquid moving in a gaseous medium which experiences secondary disintegration when the dynamic pressure due to gas stream velocity exceeds the restoring force due to surface tension. This occurs if the Weber number, defined as $$N_{Weg} = \rho_g U_r^2 D_p / \sigma_p$$

exceeds a critical value. Here $\rho_g$ is the gas density, $U_r$ is the relative velocity between gas and drop, $D_p$ is the drop diameter, and $\sigma_p$ is the surface tension of the liquid drop. The critical value is about 13 for liquids of low viscosity when the relative velocity is applied very suddenly, as would be the case for an impinging shock front. This is termed stripping breakup. If the relative velocity is applied slowly, then the value is about 22. This would be the case, for instance, for a drop accelerating under gravity. Intuitively, one would expect the critical value to increase with the viscosity of the liquid, and this is indeed the case. The critical value will increase by the factor $k_{\mu p}$ defined by $$k_{\mu p} = 1 + \left( \mu_p / \sqrt{D_p \rho_p \sigma_p} \right),$$

where $\mu_p$ is the liquid viscosity. This makes sense physically, since a higher liquid viscosity tends to make droplet breakup more difficult.

Now, as a given droplet breaks up into ever smaller droplets, eventually a point will be reached where the Weber number is no longer greater than the critical value, and further breakup is not possible. According to this model, particle size depends primarily on gas density $\rho$, the relative velocity $U_r$, and the surface tension $\sigma_m$. For a given pure liquid, the only way to produce finer particles is to increase $\rho$ and $U_r$. The best approach for refining particle size is to increase the relative velocity $U_r$, and if possible to also increase the density of the atomizing gas stream. Pulsed plasma jet technology provides an innovative solution to this problem.

Pulsed Plasma Jet Atomization is a gas atomization technique which has the distinct advantage of operating at both higher gas density and higher gas flow velocity, the two most important controllable factors in how small a powder can be manufactured. Flow velocities can be increased by at least an order of magnitude relative to conventional gas atomization techniques, while simultaneously maintaining comparable gas densities. In some cases, it may even be possible to increase the gas density by a factor of up to 10–30 at such velocities.

The invention replaces the cold gas stream in conventional gas atomization with a repetitively pulsed, high pressure, high temperature, plasma jet which repeatedly impacts, disintegrates and then further atomizes the melt stream material into fine droplets. The formation of droplets in the 0.1–10 $\mu$m size is relatively straightforward. A large market exists for powders in the 1–10 $\mu$m range, and a smaller but important market exists for soft magnetic powders with diameters of about 0.3–1.0 $\mu$m.

The pulsed process has several specific advantages over conventional gas atomization techniques which makes it attractive from a commercial production point of view. The first of these is that the pulsed plasma jet provides an initial strong shock which induces primary disintegration of the melt stream in a manner which is more efficient than allowed by continuous flow techniques. This is partly a result of the fast, high pressure shock front (~1 kbar) which impacts the melt stream, and partly due to the fact that the melt stream can be arranged so that it and the plasma jet have comparable cross-sectional dimensions in the atomization interaction zone. For a quasi-continuous operating mode, the plasma jet is pulsed at a rate which equals the time for the melt stream to cross the interaction zone. This allows the entire melt "slug" to experience the full action of the incident shock front. Arranging the geometry such that plasma jets are incident from more than one direction, including directly at each other, impacts the melt stream by strong shocks from opposite sides simultaneously. The jitter in plasma jet firing times is reduced essentially to zero by running the currents in each capillary discharge in series. Arrival times of the separate shocks can also be timed such that the second shock arrives after a preset delay relative to the first shock front. Arranging multiple jets so that shocks arrive from different directions provides a more chaotic and complete breakup of the initial melt.

Another advantage is that after the initial breakup of the melt stream, further secondary disintegration is induced by the very high speed gas flow behind the shock. Although gas flow velocities as high as 20–30 km/s are readily attained in vacuum, the invention operates with gas velocities in the 3–10 km/s range. Conventional gas atomization is limited to a few hundred meters per second due to the low temperature of the gas. The plasma jet's high velocity is obtained without a corresponding decrease in gas density (relative to cold gas atomizers), and thus provides a momentum flux two orders of magnitude higher than is possible with cold gases. In preferred embodiments it is possible to increase gas density over that of atmospheric air by a factor of up to 10–30.

The high temperature of the gas (which can be greater than the melt temperature) prevents premature solidification of the droplets prior to complete disintegration. This feature, along with the higher gas flow velocity may help prevent the formation of satellites on droplets, i.e. smaller droplets that attach to the main droplet. Such satellites have undesirable effects on the flowability of the powder.

In addition, conventional gas atomizers sometimes experience problems with recirculation of the powder in the nozzle region. This "shadowing" effect impacts efficiency by entraining cold powder into the gas stream and generating satellites. It can also obscure observation of the melt fragmentation process. Pulsed operation alleviates or even eliminates this issue entirely.

The gas stream used in conventional gas atomization is replaced with a much higher momentum flux ($\rho U^2$) plasma jet which has the additional feature of delivering strong incident shocks which aid in primary disintegration of the melt stream. A series of short duration, high pressure plasma pulses more effectively fragments a melt stream than a steady stream of gas or liquid. The pulses introduce sharp velocity gradients in the melt and cause it to disintegrate into finer particles than would the velocity gradients produced by constant pressure fluid streams. The plasma pulses have peak pressures of approximately one kilobar, which is an order of magnitude higher than that achievable during conventional gas atomization. This high pressure assists in improving the efficiency of disintegration.

In one embodiment, a plasma jet is directed at a melt stream to atomize the stream, while in another embodiment, a plasma jet is directed at an arc region between two electrodes where molten droplets are stripped from the electrode surface and atomized.

The particle size distribution for all gas atomized powders has been found to follow a log-normal form, such that the size distribution typically becomes narrower as the mean particle size decreases. Plasma jet atomization should follow this same trend, implying that narrower size distributions should be expected due to the lower mean size expected from the process. This will allow cheaper production of fine metal powders.

These and further and other objects and features of the invention are apparent in the disclosure, which includes the above and ongoing written specifications, with the claims and the drawings.

BRIEF DESCRIPTION OF THE DRAWINGS

Table I shows the approximate operating parameters for a preferred capillary system.

Table II lists the size distribution of the Cu powders found in FIGS. 9 and 10.

FIG. 2A further shows a capillary embodiment in which a small trigger capillary fires into a main capillary providing a conducting breakdown path for initiating the main discharge.

FIG. 2B further shows a capillary embodiment in which an inductively coupled high voltage spike induces a corona-like discharge in the main capillary to provide a breakdown path for the main discharge.

DETAILED DESCRIPTION OF THE PREFERRED EMBODIMENTS

Figure 1:
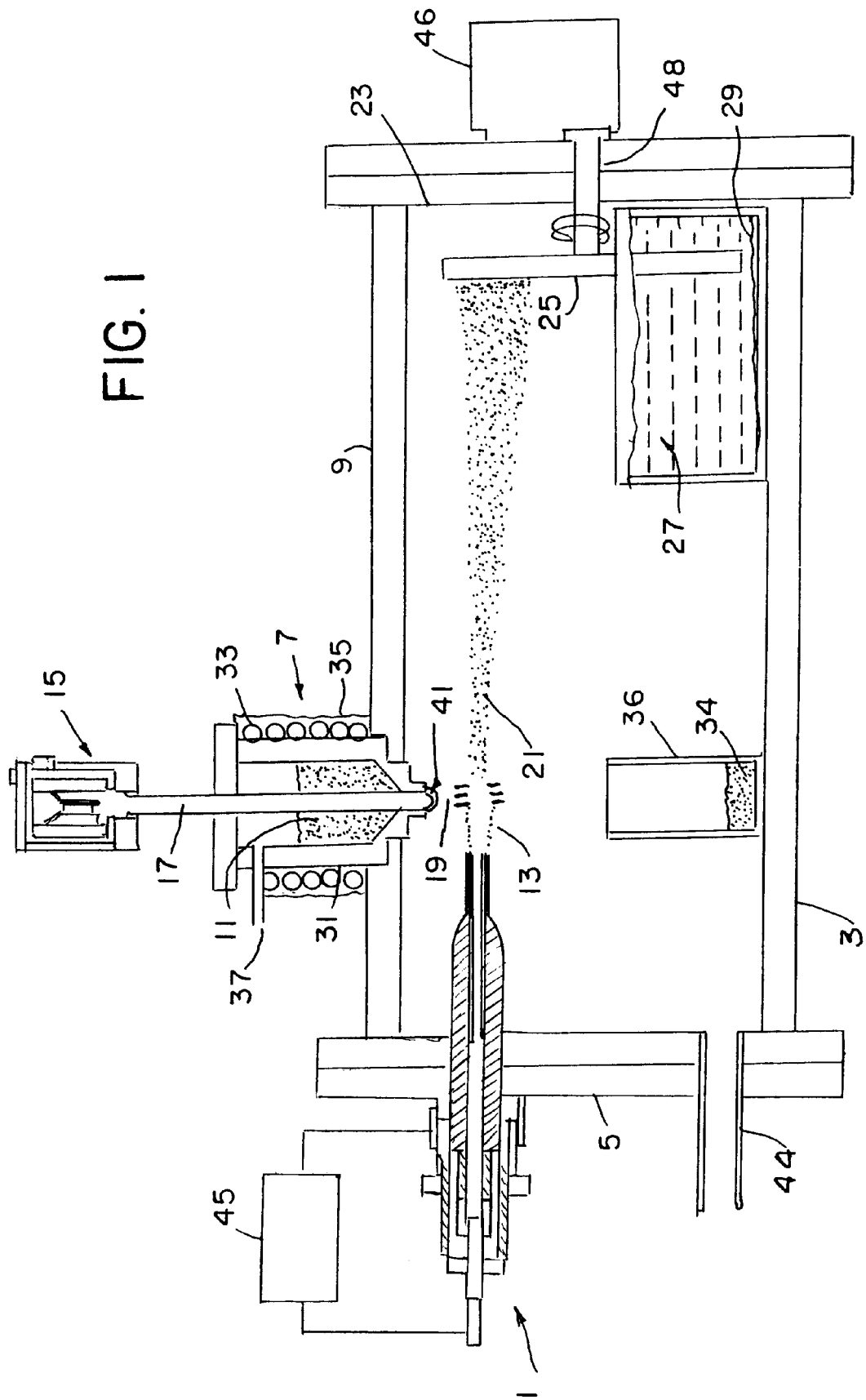
FIG. 1 is a pulsed plasma jet apparatus using intermittent melt stream, which accumulates fine copper powder over several pulses.

A schematic representation of one early embodiment of the invention in a single pulse mode is shown in FIG. 1. The capillary discharge pulsed plasma jet generator unit 1 is mounted on the end of a vacuum tank 3 with appropriate vacuum flanges 5. The melt apparatus 7 is mounted on top 9 of the tank 3. The melt 11 is injected under inert gas pressure or by gravity straight down across the path of the plasma jet 13, which is directed horizontally. A solenoid 15 temporarily opens and closes a plunger 17 of a valve to provide a brief squirt 19 of melt 11.

The plasma jet 13 is fired after short delays timed to roughly coincide with the midpoint in time of the squirts 19. When the plasma jet fires, molten droplets 21 are sprayed forward toward the end 23 of the tank 3. The droplets 21 impact on a movable substrate. For example, powders may be directed against rotating disk 25 which has a continuously replenished oil film on its surface. The oil 27 provides rapid cooling and a medium to collect the copper powder 29. The powder 29 collects in the oil bath and is decanted and cleaned.

The melt 11 contained in the crucible 31 may flow continuously while the plasma jet breaks up the melt stream into powder. For a repetitively pulsed plasma jet, the pulse rate is roughly determined by the time it takes the melt 11 to fall across the interaction region. Depending on the various system parameters, this pulse rate ranges from 10 pps to several hundred pps. Since it would be impractical to make a new batch of melt for each plasma jet pulse 13, an intermittent opening/closing valve 17 is provided which interrupts the melt flow 11 between each plasma pulse. Over a period of hours or days, significant amounts of powder are produced.

The crucible 31 has a surrounding heating element 33. Insulation 35 surrounds the heating element. The metallic material, in this case copper, 11 is melted in a crucible. An inert gas inlet 37 insures against oxidation of the molten metal surface and pressurizes the crucible. A metal orifice or multiple metal orifices are formed in the bottom of the crucible. Plunger 17 driven by the solenoid 15 is raised and lowered to open and close the orifice.

A vacuum is withdrawn or inert gas is supplied through conduit 44 to the tank 3. A variable speed motor 46 mounted on the tank end 23 rotates shaft 48 and disc 25 into and out of the oil 27 in the reservoir. The accumulated fine metal powder 29 falls to the bottom of the reservoir. Waste melt 34, which escapes the disintegration by the plasma jet 13 falls into container 36 for subsequent removal and reuse by reintroducing the waste melt to the crucible 31.

A power supply 45 is connected to the electrodes of the capillary discharge unit 1.

A commercial device operates for long periods of time at commercially useful pulse rates. The use of ceramic capillary liners and the injection of a working fluid in the form of a gas or liquid are preferred, with liquid being the preferred choice. The ceramic capillary operates in a non-ablating mode by controlling (limiting) the peak temperature and pulse width for each discharge so that surface vaporization never occurs. This can be achieved by limiting the temperature to about 1 eV for discharge times of no more than a few hundred microseconds.

Figure 2A:
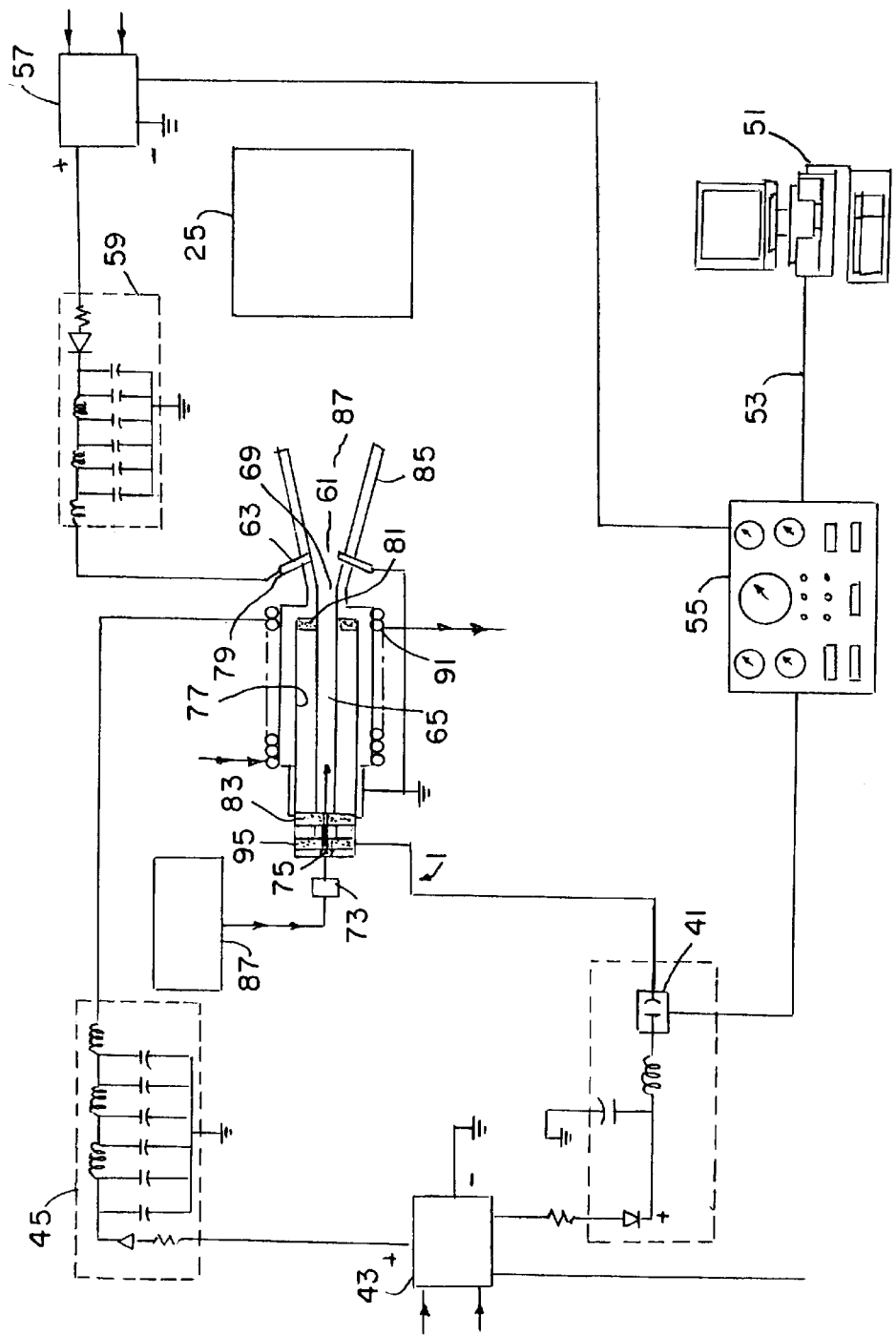
FIGS. 2A and 2B schematically show a pulsed wire-arc powder synthesis configuration. The substrate shown in the figure would be replaced with a powder collection system.
Figure 2B:
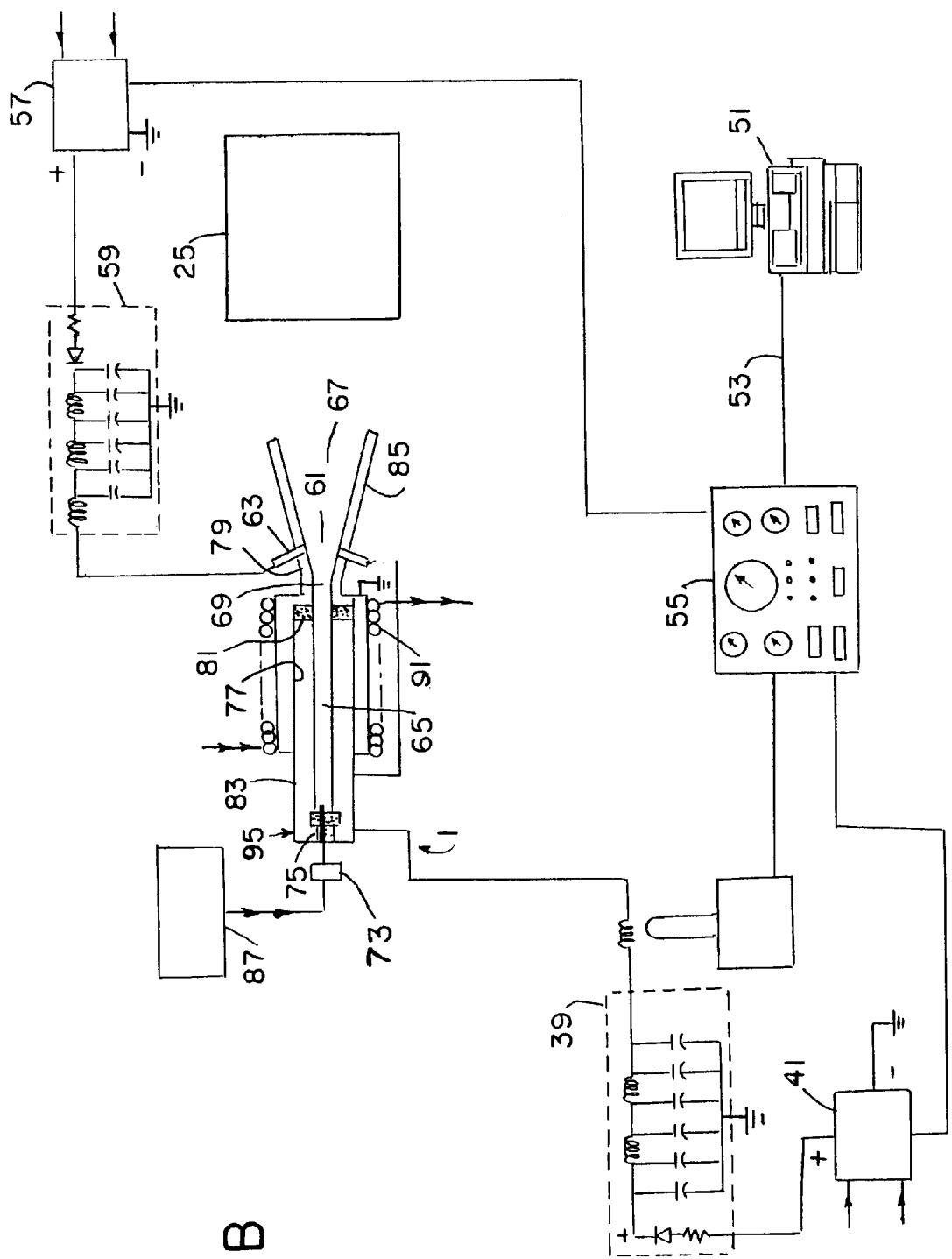

An alternative and preferred embodiment directs a pulsed plasma jet at the melted material on surfaces of wires as shown in FIG. 2. In this embodiment, molten metal droplets are generated in a pulsed arc 61 between two wire electrodes 63. One or both electrodes are consumable electrodes which are fed from holders. The arc 61 heats and melts the surface of the electrodes, and capillary 65 produces a plasma jet 69 that strips and atomizes this molten material from wire electrodes 63 into particles 67. The arc 61 may be continuous or pulsed.

A computer 51 with a fiber optic link 53 is connected to a control system 55. The control system controls a wire arc charging supply 57, which charges a 0.3 to 0.5 kJ arc power supply 59. The control system 55 also controls the plasma jet charging power supply converter 43 and a 1 to 10 kJ capillary power supply storage bank 45. A liquid argon supply 87 supplies liquid argon to the inlet 75 of the plasma jet unit 1. The plasma jet is cooled with a cooling water coil 91. A trigger power supply 41, which receives direct current from power supply 43, is controlled by the control system 55 to provide power to the trigger electrode 95.

This preferred configuration has several advantages over the melt stream embodiment of FIG. 1. Droplet formation is localized to a small region allowing better coupling between the plasma jet 69 and the molten droplets 67. Initial droplet formation is more controlled and direct than in a melt stream. Energy efficiency is greatly improved, since all Joule heating goes directly to melt electrode material. Pulsed droplet formation is easier to couple efficiently to a pulsed plasma jet. The pulse rate can be controlled independently of gravity and fall distance. Production of small batch runs is just as cost effective as large batch runs. The system is readily scalable to virtually any size at no cost penalty, implying that large high capital cost production units can be replaced by multiple lower cost units. Continuous operation is possible rather than batch runs. No premelting of metal in a crucible is required, a definite advantage for working with high melting point metals, and which also implies that the system can achieve full capacity operation virtually instantaneously. Physical size of production units can be reduced over conventional melt stream systems. The physical orientation of the unit can be horizontal or vertical or at an angle in between. Orientation of the plasma jet/wire arc configuration can be either horizontal, vertical, or any convenient angle in between.

The pulsed plasma jet 69 produced by the capillary 65 is oriented such that the jet 69 aims directly between the wire electrodes 63 extending from mounts in the nozzle. The high velocity jet 69 strips, atomizes and accelerates the molten particles, producing fine particles and preventing their agglomeration.

A preferred capillary system has the parameters shown in Table I. The ceramic capillary structure (boron nitride, SiC, $Si_3N_4$ or others) allows non-ablative operation. For production of powders at higher rates, the capillary system of Table 1 can be easily scaled to larger size.

The working fluid is provided by injection of liquid argon, from supply 87 which easily provides the mass required to fill the capillary chamber 65 with a gas equivalent of 10–30 atmospheres, but without the need of mechanical confinement. The liquid argon is admitted through a triggered fast acting valve 73 or an automatic check valve at the small inlet orifice 75. The argon partially vaporizes on contact with the walls 77, and quickly fills the capillary chamber 65 with gas. The preferred working fluid is liquid argon. Other useful liquids include liquid nitrogen, liquid hydrocarbons, and water.

Before the gas has sufficient time to flow out the nozzle 79, which occurs on a time scale of a few msec, the capillary electrodes 81, 83 generate a spark which induces breakdown through the gas of the entire capillary channel. The discharge quickly raises the capillary pressure about 1 kbar (~15,000 psi) and to a temperature of roughly 1 eV (11,600° K.).

The main capillary discharge is initiated with either of two preferred methods. In the first preferred method shown in FIG. 2A, a small capillary injects a high temperature plasma jet into the main capillary which causes high voltage breakdown across the main capillary electrodes. In the second preferred method shown in FIG. 2B, a high voltage corona discharge is induced across the main capillary using an inductively coupled high voltage spike from a very small capacitance. The second method is the more preferred of the two methods.

The wire electrodes 63 penetrate through the barrel/nozzle assembly 85 and are roughly flush with the inner walls. The optimal axial location of the wire electrodes is close to the capillary anode 81. The nozzle 85 has a slight taper of about 5–30°.

Figure 3A:
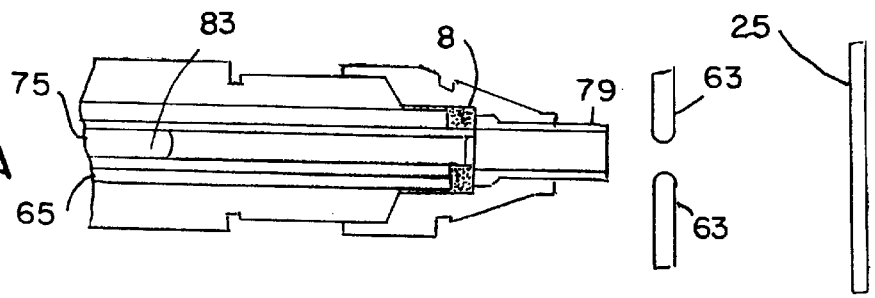
FIGS. 3A, 3B, 3C and 3D are cross-sections of the four-step process. The substrate shown in FIGS. 3A–3D would be replaced with a powder collection system.
Figure 3B:
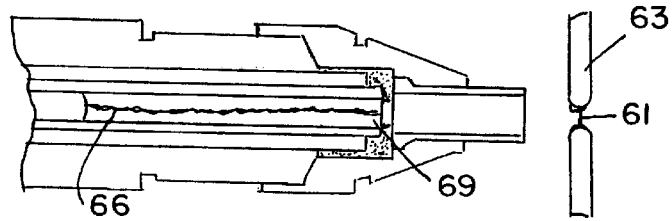

FIGS. 3A–3D show the four-step process of the invention. The capillary 65 has the cathode 83 and the anode 81, and is connected to a barrel 79. Wires 63 provide a cathode and an anode opposite the substrate 25. The substrate shown in FIGS. 3A–3D would be replaced with a power collection system. As shown in FIG. 3A, a working liquid is admitted to the capillary 65 through the inlet 75 in the cathode 83, and the liquid immediately forms a mist within the warm capillary 65. As shown in FIG. 3B, arcs 61 and 66 are ignited. Arc 61 melts the surface of the wires 63 at the arc, and arc 66 creates the plasma 69 within the capillary 65.

Figure 3C:
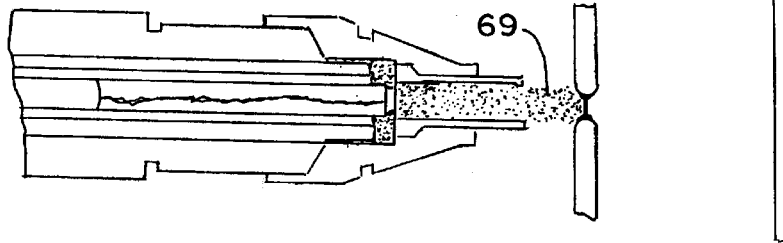

As shown in FIG. 3C, the high speed, high temperature plasma 69 exits the capillary.

Figure 3D:
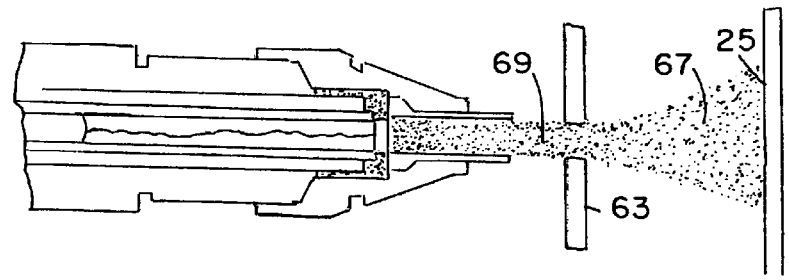

In FIG. 3D, the plasma 69 is shown stripping the melted particles from the wires 63 for accelerating the particles 67 toward the substrate 25.

Liquid injection has the additional potential advantage that working fluid mass can be introduced into the capillary quasi-continuously, even during the discharge, as long as the feed pressure is higher than the capillary discharge pressure. That allows for the possibility of extending the discharge duration without capillary burnout due to mass starvation. For a pulsed wire arc device, continuous injection would not be necessary. Pulsed injection can supply sufficient working fluid to achieve the performance desired.

Heating of a liquid by an electrical discharge has been analyzed and experimentally evaluated before and is governed by heat transport. Once evaporated, the vapor is heated by the discharge plasma to a temperature and pressure determined by the discharge power, chamber geometry, and mass flow rate. Proper mass distribution in the chamber is important to prevent local burnout.

While geometric conditions can vary widely in gas atomization, the proposed mechanisms of droplet formation involve the following steps. First, an initiation occurs of a sinuous wave which rapidly increases in amplitude. Then the wave detaches from the bulk of the liquid to produce a ligament whose dimensions depend on the wavelength at disintegration. Finally, the ligament breaks up into spherical droplets. Droplet breakup and atomization is essentially a competition between external dynamic pressure and viscous shear forces which tend to tear the drop apart, and the surface tension and internal viscous forces which tend to resist deformation and breakup. The total amount of energy required increases rapidly as the mean particle size decreases (i.e. as the total surface area increases). Breakup and atomization of liquid droplets is ultimately governed by how efficiently energy from the atomizing fluid can be coupled into the molten metal generating fine isolated particles.

Figure 4A:
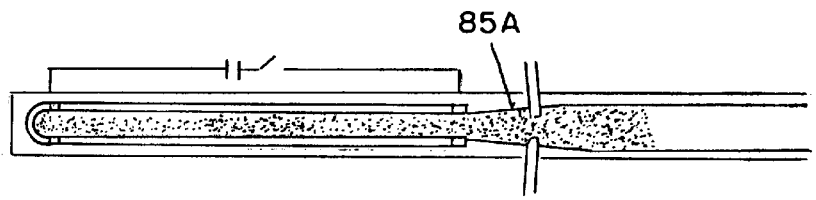
FIGS. 4A, 4B, 4C and 4D are details of four nozzle designs for the capillary.
Figure 4B:
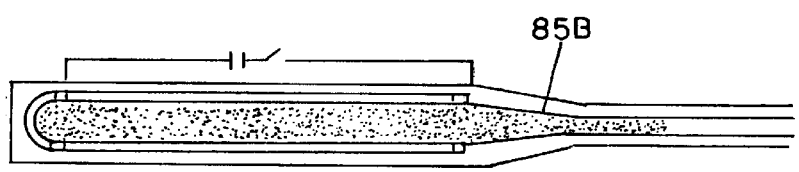
Figure 4C:
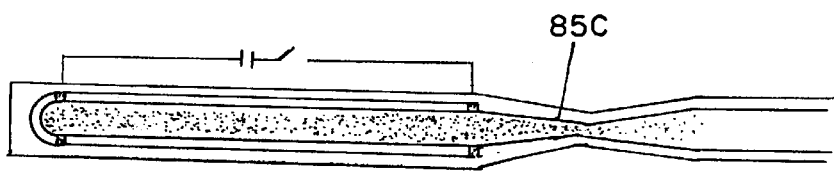

FIGS. 4A–4D show four nozzle choices for the capillary 65. FIG. 4A shows an expansion nozzle 85A. FIG. 4B shows a converging nozzle 85B connected to the capillary 65. FIG. 4C shows a converging-diverging nozzle 85C connected to the capillary 65.

Figure 4D:
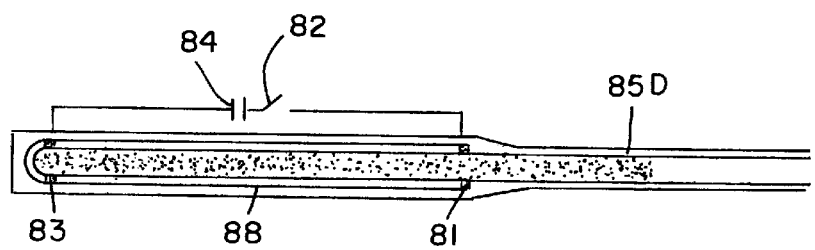

FIG. 4D shows a constant diameter nozzle 85D connected to the capillary 65. The capillary 65 has electrodes 81 and 83 and ceramic insulator linings 88.

For the Pulsed Wire Arc Sprayer, FIG. 4A, the expansion nozzle case, is preferred as the best overall configuration, with a shallow divergence angle, and no straight barrel section, or at least very short. FIG. 4D gives better performance, since the density of gas is used most effectively. A concern is that a non-diverging barrel/nozzle would lead to droplets sticking to the wall, and degrade performance.

Figure 5:
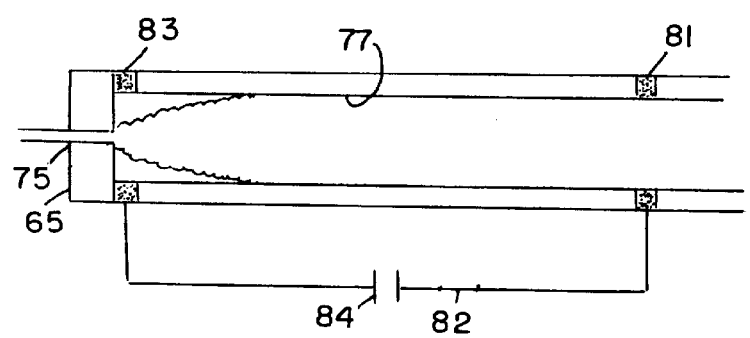
FIG. 5 is a schematic of the liquid injection method.

As shown in FIG. 5, liquid injection provides a way of introducing the working fluid in a form that does not require mechanical confinement and thus is more suitable for repetitive operation at high deposition rates. A mist of liquid droplets is injected into the capillary 65 at the liquid inlet 75 immediately before the discharge is initiated. Many of the droplets vaporize on contact with the hot capillary walls 77. The remainder stay suspended until vaporized by the arc.

The electrical discharge is provided by the capillary arc power supply 84 which is controlled by switch 82 connected to electrodes 81, 83. The arc discharge then completely vaporizes the small droplets and provides the same mass of gas that would be equivalent to tens of atmospheres of prefill pressure. That method can place the required few hundred mg (or more) of working fluid mass into the capillary.

Since a ceramic insulator is preferred to be used for the capillary liner, the thermal loads to the wall are considered to determine at what temperatures the capillary discharge can operate and for how long. The temperature rise of a surface subjected to a sudden heat flux q is given by $\Delta T = \alpha q t^{1/2}$, where $\alpha = 2/(\pi \rho c k)^{1/2}$ and $\rho$ is density, c is specific heat and k is thermal conductivity. This equation indicates that ablation can be avoided, for a given heat flux q, by keeping the pulse time sufficiently short. The so-called "grace period" is the time a surface can be exposed to a given thermal flux before ablation begins, and is different for each material as determined by its $\alpha$ and vaporization temperature.

Figure 6:
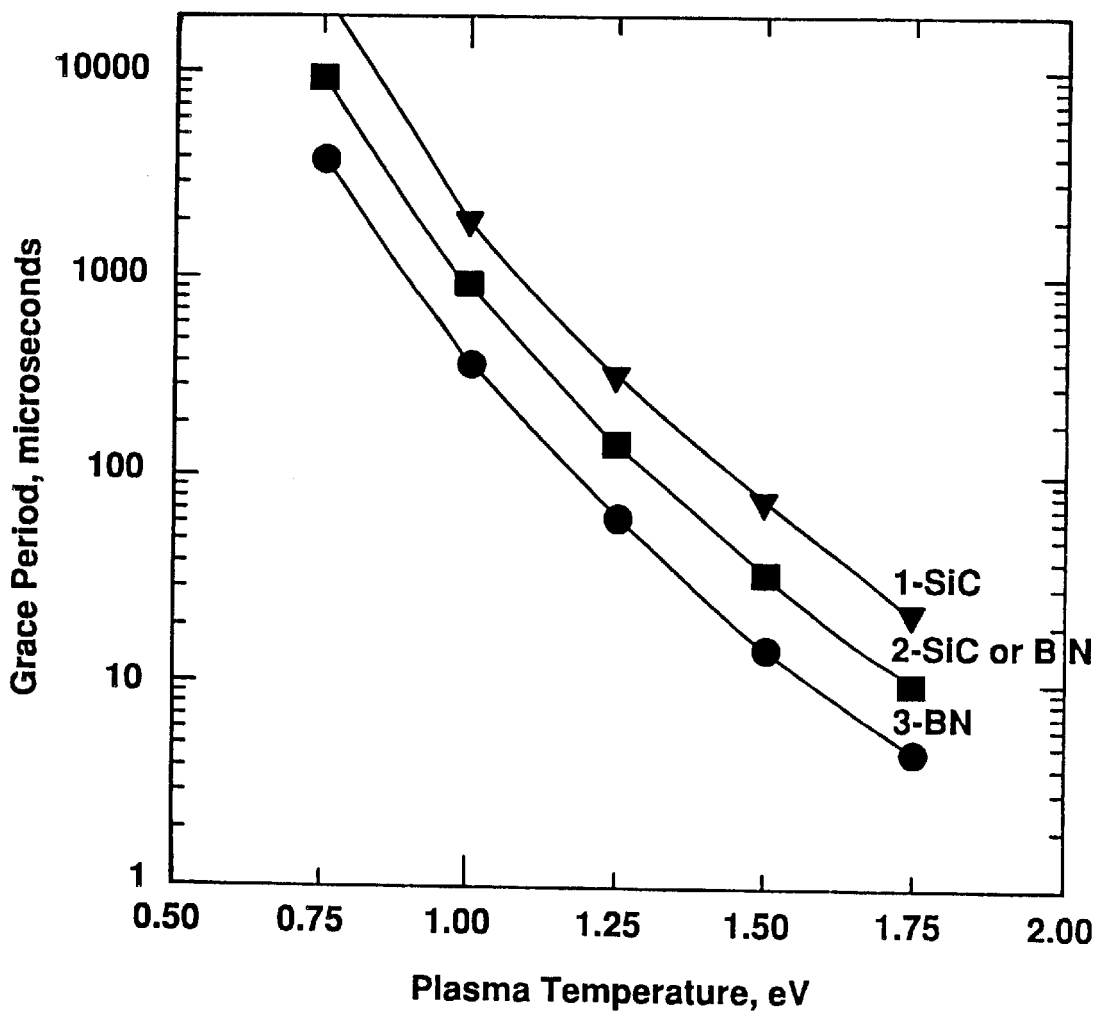
FIG. 6 illustrates the time scales for representative heat flux parameters for BN and SiC insulators.

FIG. 6 illustrates the time scales for representative heat flux parameters for a BN insulator. The curve labeled 3-BN represents the case for a flat radial temperature profile in the capillary. Curve 2, SiC or BN, represents the more realistic case in which a lower temperature boundary layer forms at the wall which can reduce the heat flux q to the wall by as much as a factor of two over the heat flux calculated from the core plasma temperature on axis. Curve 1, SiC, is for SiC with a reduced wall flux.

Figure 7A:
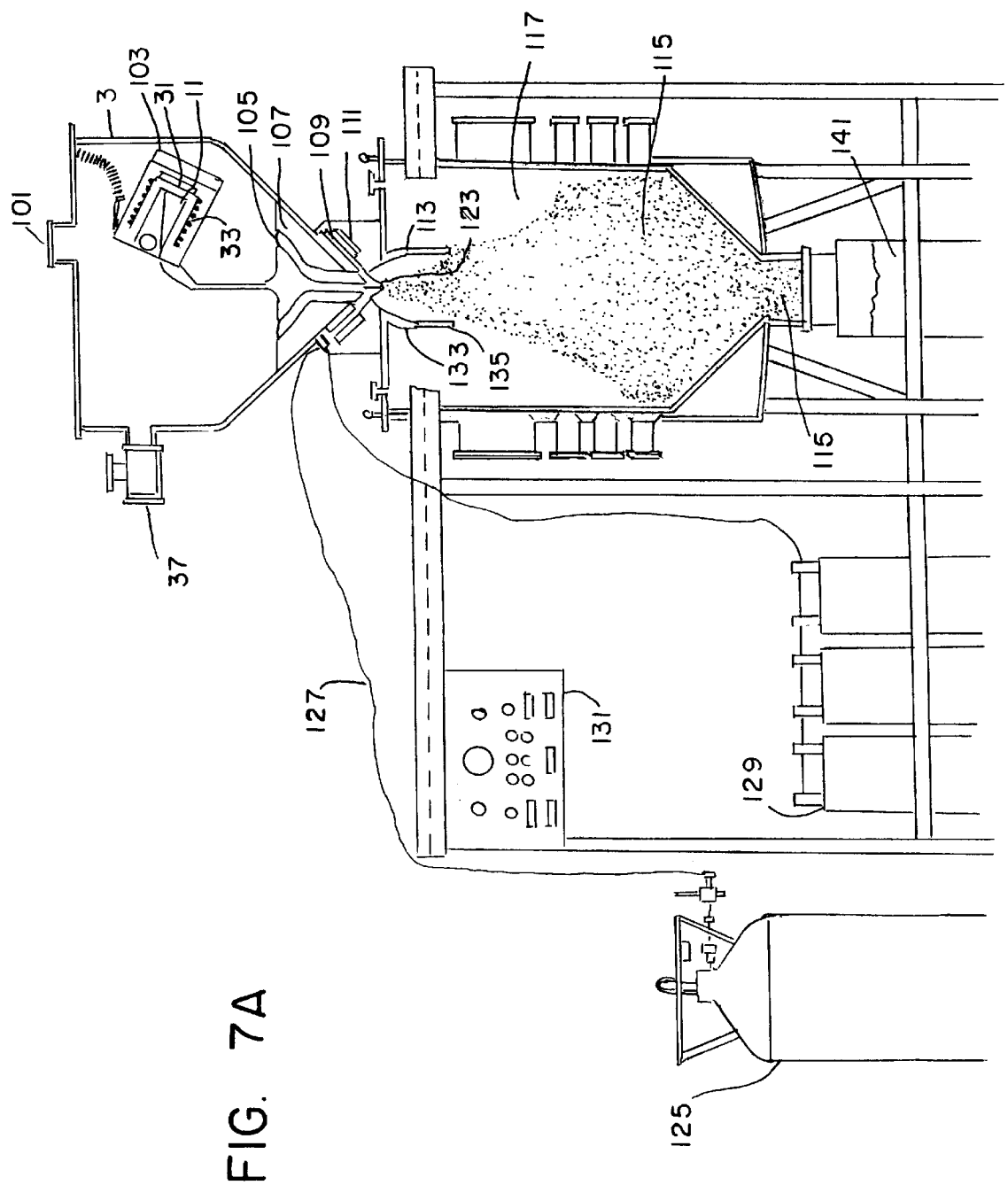
FIG. 7A is a schematic representation of a vertical embodiment using multiple plasma jets to atomize a melt into fine powders. The atomized powders are collected in an oil bath.
Figure 7B:
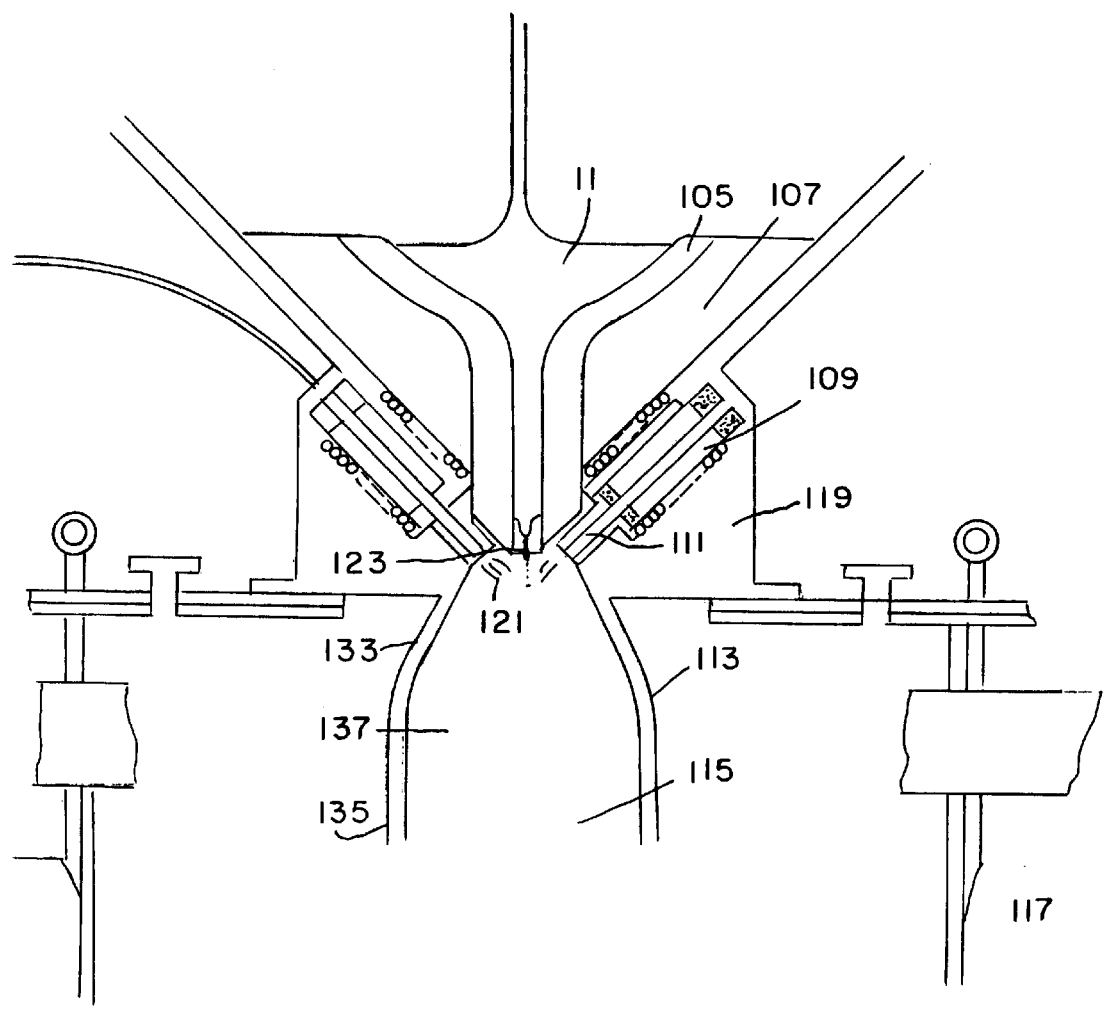
FIG. 7B is an exploded view of the vertical plasma jet-impacted melt stream apparatus.
Figure 8:
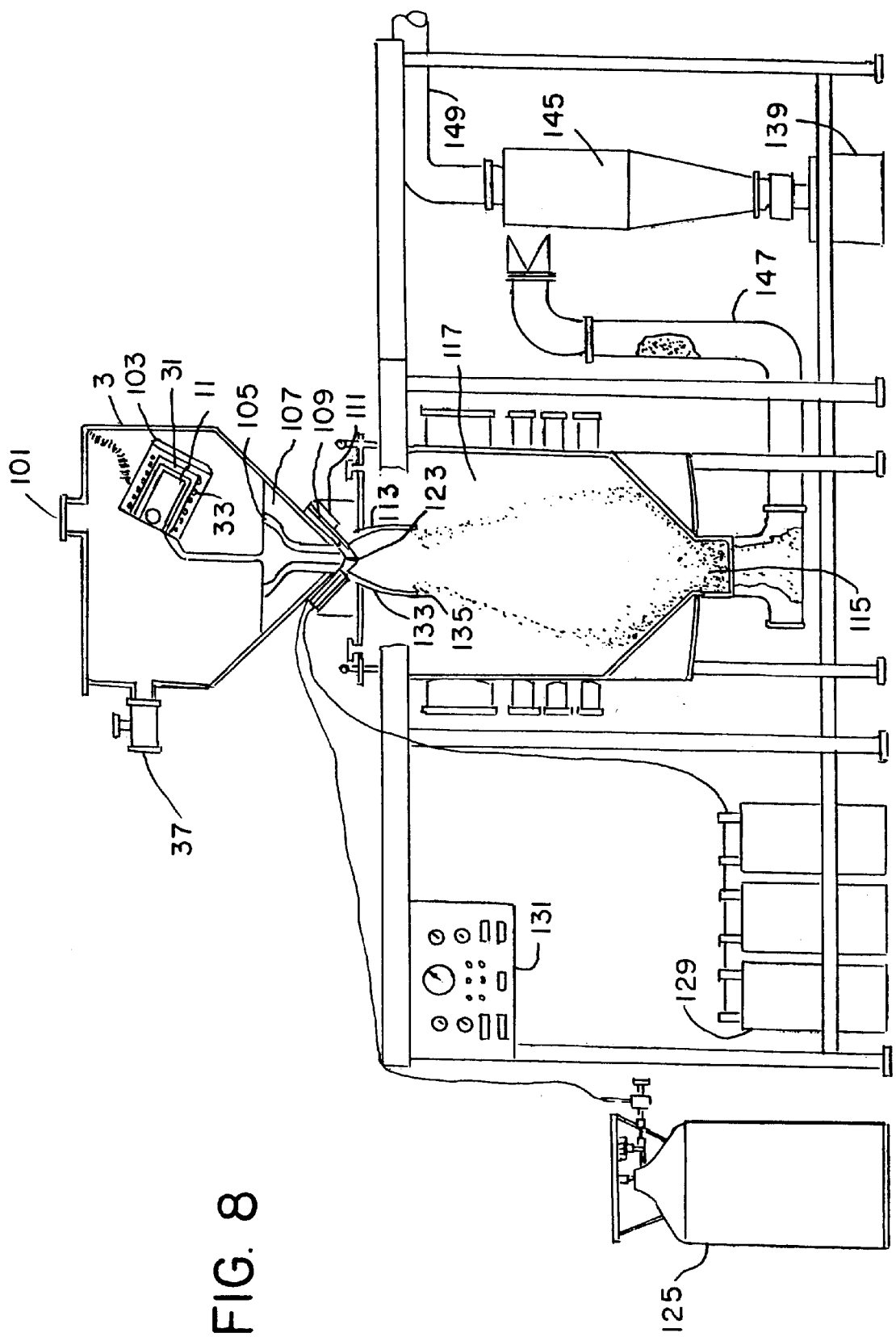
FIG. 8 is a schematic representation of a vertical embodiment using multiple plasma jets to atomize a melt into fine powders. The atomized powders are separated by a cyclone prior to being collected.

A preferred embodiment of the vertical configuration using multiple plasma jets is shown in FIGS. 7A, 7B and 8. This embodiment is similar to some configurations used with conventional gas and water atomization, but with the gas and water atomizing streams replaced with rapidly pulsed plasma jets.

Molten metal 11 is added to the crucible 31 through the fill port 101 in the top of the melting chamber 3. Molten metal 11 is held within a crucible 31 while heated by the induction furnace 103. Heat is supplied by inductive heating element 33. A vacuum or inert gas 37 is supplied to the melting chamber 3 to keep the crucible 31 in an inert atmosphere. Molten material 11 from the crucible 31 is received in a tundish 105, which is surrounded by insulation 107. Plasma jet generators 109 are mounted on supports 119 at roughly 450 angle with respect to the vertical melt stream to produce plasma jets 121, which are directed through nozzles ill, for oppositely impacting the continuous melt stream 123. Liquid working fluid is supplied to the capillary from an external supply source 125 through cryogenic feed lines 127. The plasma jet 109 is driven by the Pulse Forming Network (PFN) 129. The PFN is controlled from the control system rack 131. The number of plasma jets is determined by the size and flow rate of the melt stream with higher flow rates requiring more plasma jets. For high flow rates it may be desirable to cause the melt stream to flow downwards in an annular sheet or in a configuration wherein individual melt streams are arranged to be equally spaced around the periphery of a circle. In either of these cases a number of plasma jets would be oriented at roughly 45° angles with respect to the vertically flowing melt stream.

The capillary system with approximate parameters described in Table 1 provides a baseline set of values for a particular size. Powder production rates are readily increased by scaling up the size and energy level of the plasma jets and the number of jets being utilized.

Note that the Pulsed Plasma Jet Atomization is readily scalable to larger and smaller production rates by adjusting the size of the capillary. The energy per pulse is typically adjusted to maintain roughly 1 kbar, 1 eV peak plasma conditions in the capillary. For a given gas operating temperature, the amount of material that can be produced per pulse is roughly proportional to the gas mass in the capillary which is roughly proportional to the volume of the capillary. The energy per pulse also scales as the gas mass for constant peak temperature. This drives the system to higher pressure if the capillary volume were to remain constant. The capillary can operate at pressures 2–4 times larger, for example, if SiC is used instead of BN for the capillary liner. If the effective prefill pressure and the input electrical energy is scaled up a factor of two, the material sprayed per pulse doubles. Increasing the firing rate increases the spray rate proportionally. Although higher pulse rates are possible, a practical upper bound on the firing rate appears to be in the 50–100 Hz range.

A confinement nozzle 113 with diverging walls 133 then straight walls 135 confines the plasma jets to impact the melt and accelerate and impact the resultant atomized particles 137. The particles solidify into fine atomized powders 115 as they are accelerated though the atomization chamber 117 or as they cool in the oil bath. The fine powders 115 are collected in the oil filled powder collection pot 139. The oil 141 provides rapid cooling and a medium to collect the powder 115. The powder collects in the bottom 143 of the oil pot and is later separated via centrifuge.

The plasma jets are repetitively fired at a rate which matches the fall time of the melt stream across the interaction zone. In another embodiment, a series of two or more rings of plasma jets may be arranged in vertical rows and fired either simultaneously or in alternating sequences in time.

In another preferred embodiment, as shown in FIG. 8, the atomized powders are separated by a cyclone 145. Upon leaving the atomization chamber 117, suction pressure causes the atomized powders 115 to flow through the transport duct 147 into a cyclone. The cyclone 145 separates the atomized powders 115 from other foreign material. The powders 115 are collected in the powder collection pot 139, while other foreign material is passed out through exhaust duct 149 to an exhaust filter.

Powders were produced using the melt stream configuration of FIG. 1 and using the wire arc configuration of FIG. 3. The collected metal powders were analyzed by scanning electron microscope (SEM) to provide size and morphology of the powder particles. X-ray maps of the representative areas were obtained to identify the metal powders present in the system. Finally, X-ray energy dispersive spectroscopy (EDS) of representative powders were performed to identify the constituent elements of the metal powders.

Figure 10:
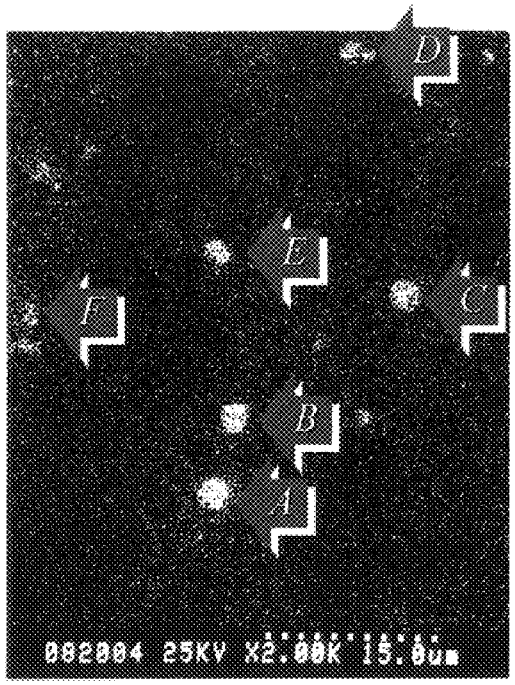
FIG. 10 is a X-ray map of the region shown in FIG. 9.
Figure 9:
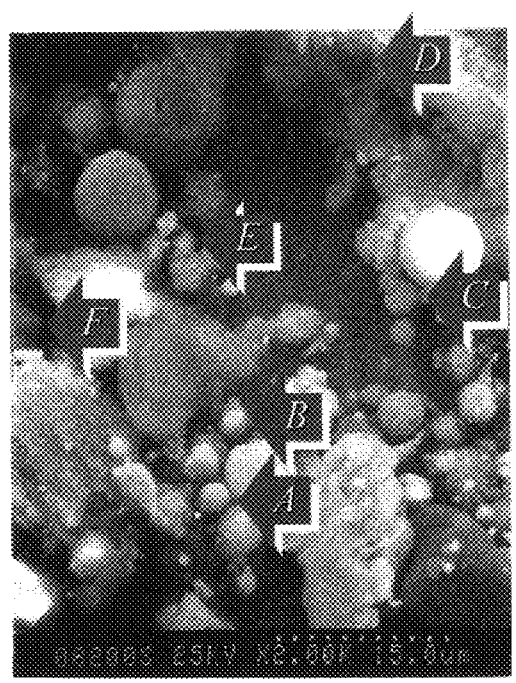
FIG. 9 is a SEM micrograph of Cu powders.
Figure 12:
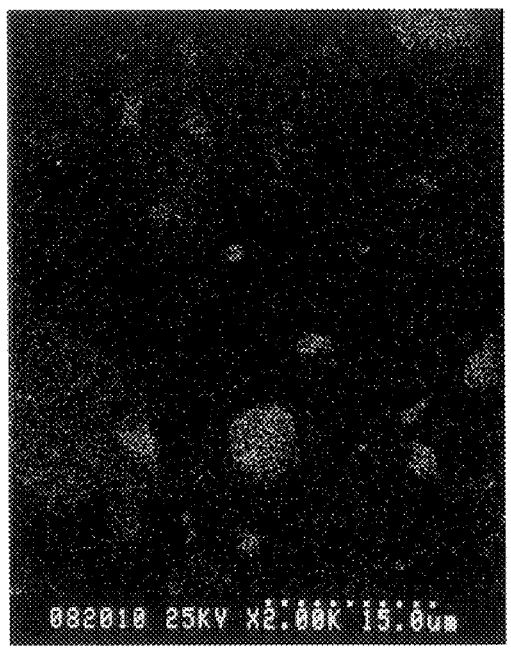
FIG. 12 is a X-ray map of the region shown in FIG. 9 showing other powder elements present.
Figure 11:
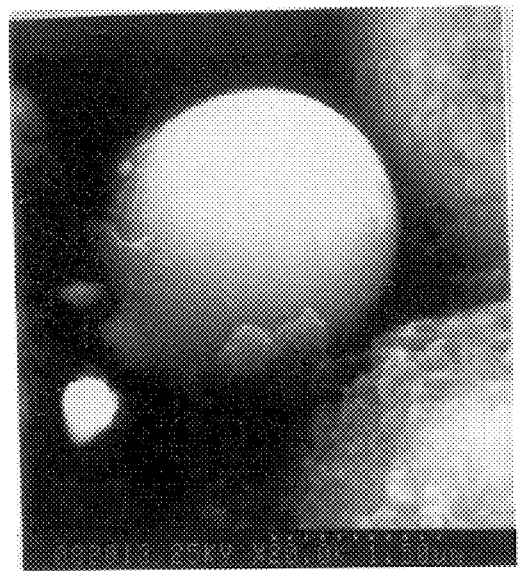
FIG. 11 is a high magnification micrograph of a single copper powder.

A low magnification (2K) SEM micrograph of Cu powders produced by wire-arc feed of FIG. 3 is shown in FIG. 9, and its corresponding Cu X-ray map is shown in FIG. 10. The Cu powders are identified by arrows A–F. The micrograph in FIG. 9 shows that the powders are 2 to 15 $\mu$m. The Cu X-ray map in FIG. 10 of the same region shows the Cu powders seen in the micrograph. It is seen that the smaller powders (about 2.5 to 3 $\mu$m) are Cu. Table II lists the size of the Cu powders A–F. The table shows that the Cu powders produced are in a narrow size range of 2.5 to 3 $\mu$m. The Cu powder A was confirmed by a higher magnification (20K) SEM micrograph shown in FIG. 11. Both FIGS. 9 and 11 show that the Cu powders are spherical in shape and have a fairly smooth surface morphology. Other elements (W, Fe, Ni and C) are present as impurities. Based on the X-ray maps for W, shown in FIG. 12, Fe, Ni and C, it is seen that these impurities do not appear to be present as part of the Cu powders rather they are present as separate powders of larger size which originated from the sintered tungsten electrodes used in these early experiments.

Figure 14:
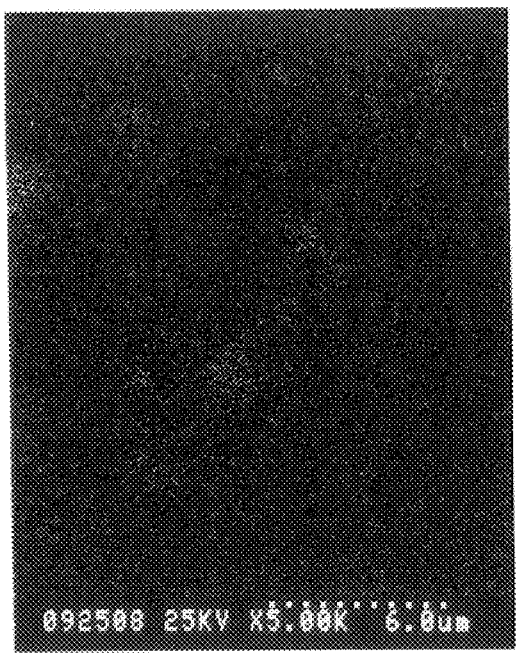
FIG. 14 is a X-ray map of the region shown in FIG. 13.
Figure 13:
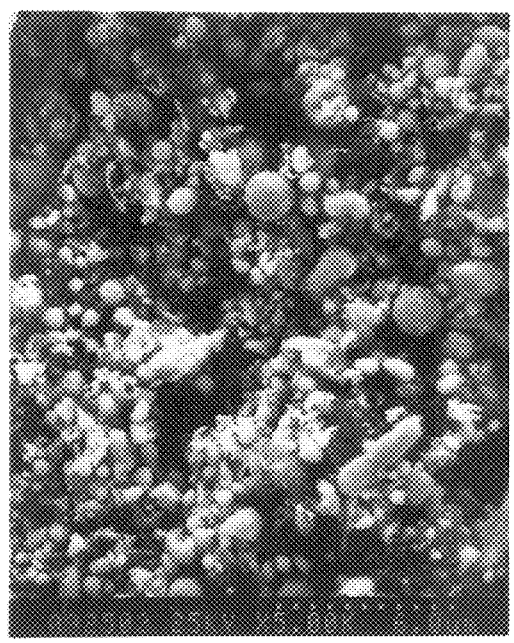
FIG. 13 is a SEM micrograph of steel powders.

A 5K SEM micrograph of steel produced by wire-arc feed of FIG. 3 is shown in FIG. 13, and its corresponding steel X-ray map, FIG. 14. FIGS. 13 and 14 appear to indicate that the steel powders are less then 6 $\mu$m in size.

Unique and novel features of the technology result in many benefits. Novel features include application of pulsed power and pulsed plasma jet technologies to fine metal powder synthesis. Use of inert gas prevents undesirable chemical reactions. One novel configuration uses pulsed wire arc metal feed rather than a melt stream.

While the invention has been described with reference to specific embodiments, modifications and variations of the invention may be constructed without departing from the scope of the invention, which is defined in the following claims.

TABLE 1

Approximate Operating Parameters for a Baseline Capillary System used for both atomization by wire arc and by melt stream.

| System Parameter | Value |
| --- | --- |
| Barrel/Nozzle Length | 10–20 cm |
| Capillary ID | 1.0 cm |
| Capillary length | 10 cm |
| Gas density | 0.049 gm/cm$^3$ |
| Gas mass in capillary | 308 mg |
| Peak droplet velocity | 1600–1800 m/s |
| Spray rate | 1–15 kg/hr |
| Droplet mass per pulse | 30–90 mg |
| Pulse rate | 10–50 pps |
| Fill Pressure | ~30 atm |
| Peak Pressure | ~1000 atm |
| Peak temperature | ~1 eV |
| Capillary Energy per pulse | 1–2 kJ |
| Average jet power | 10–50 kW |
| Capillary Current | 10–30 kA |
| Discharge Duration | ~100 $\mu$s |

TABLE II

Size Distribution of Cu Powders

| Cu powder identification | Powder size (diameter in µm) |
|---|---|
| A | 3 |
| B | 2.5 |
| C | 3 |
| D | 2.5 |
| E | 2.5 |
| F | 2.5 |

We claim:

1. Apparatus for manufacturing fine powders, comprising a source of melted material, melted material provided from the source, a pulsed plasma jet generator for generating a pulsed plasma jet and directing the pulsed plasma jet to impact the melted material for atomizing the material into particles, and a chamber for collecting powder formed from the particles.

2. The apparatus of claim 1, further comprising an outlet nozzle connected to the pulsed plasma jet generator for directing the pulsed plasma jet to the melted material.

3. The apparatus of claim 2, wherein the chamber encloses the nozzle and the melted material provided from the source.

4. The apparatus of claim 3, further comprising a vacuum or inert gas connected to the chamber.

5. The apparatus of claim 1, further comprising a power supply connected to the pulsed plasma jet generator, and a controller connected to the power supply for repetitively pulsing the plasma jet for repetitively impacting the melted material.

6. The apparatus of claim 5, wherein the source further comprises wires mounted to form a gap between the wires in a path of the pulsed plasma jet, an arc power supply connected to the wires for igniting an arc between the wires and heating the wires for providing the melted material, and a controller connected to the arc power supply for repetitively igniting the arc.

7. The apparatus of claim 6, further comprising a confinement nozzle connected to the wires around the gap for confining the pulsed plasma jet and the particles.

8. The apparatus of claim 5, wherein the source further comprises a melted material holder for releasing the melted material into the repetitively pulsed plasma jet.

9. The apparatus of claim 8, wherein the melted material holder is positioned above the plasma jet for releasing a melt stream into the pulsed plasma jet.

10. The apparatus of claim 9, wherein the source further comprises a melt stream valve for releasing the melt stream in squirts.

11. The apparatus of claim 9, wherein the pulsed plasma jet generator further comprises multiple pulsed plasma jet generators for generating multiple pulsed plasma jets and directing the multiple pulsed plasma jets to the melt stream, and wherein the controller controls the plasma jet power supply for repetitively pulsing the plasma jets for atomizing the melted material.

12. The apparatus of claim 1, wherein the supplying of melted material comprises feeding wires toward a gap in front of the pulsed plasma jets, igniting a spark across the gap and melting material on the wires.

13. The apparatus of claim 1, wherein the repetitively generating pulsed plasma jet further comprises a supply of liquid material connected to the pulsed plasma jet generator, and spaced electrodes in the generator and a pulsing power supply connected to the electrodes for repetitively igniting a spark between the electrodes in the plasma jet generator, repetitively producing a plasma and expelling the plasma in pulsed plasma jets from the generator.

14. The apparatus of claim 13, wherein the supply of the liquid material comprises a supply of liquid material selected from the group consisting of cryogenic liquid argon, cryogenic liquid nitrogen, water and liquid hydrocarbons as a working fluid for the plasma jet generator.

15. The apparatus of claim 9, further comprising a controller connected to the generator for controlling timing of the repetitively pulsed plasma jets for impacting all of the material in the melt stream.

16. A method for manufacturing fine powders, comprising supplying melted material, repetitively pulsing a plasma jet generator, repetitively generating pulsed plasma jets, directing the pulsed plasma jets to the melted material, impacting the melted material with the pulsed plasma jets, atomizing the melted material into particles, solidifying the particles into powder and collecting the powder in a chamber.

17. The method of claim 16, wherein the repetitively generating pulsed plasma jet further comprises supplying liquid material to the pulsed plasma jet generator, repetitively gasifying the liquid material in the plasma jet generator, and repetitively igniting a spark between electrodes in the plasma jet generator producing a plasma and expelling the plasma in pulsed plasma jets from the generator.

18. The method of claim 17, wherein the supplying of the liquid material comprises supplying the liquid material selected from the group consisting of cryogenic liquid argon, cryogenic liquid nitrogen, water and liquid hydrocarbon as a working fluid for the plasma jet generator.

19. The method of claim 16, wherein the supplying of melted material further comprises releasing a melt stream into a position for impacting with the plasma jets.

20. The method of claim 19, further comprising repetitively interrupting the melt stream.

21. The method of claim 19 further comprising continuously releasing the melt stream and further comprising controlling timing of the repetitively pulsed plasma jets for impacting all of the material in the melt stream.

22. The method of claim 19, further comprising repetitively pulsing plural plasma jets, and impacting the melt stream with the plural plasma jets.

23. The method of claim 16, wherein the atomizing further comprises further atomizing the atomized particles with the repetitively pulsed plasma jets.

24. The method of claim 16, wherein the supplying of melted material comprises feeding wires toward a gap in front of the pulsed plasma jets, igniting a spark across the gap, and melting material on the wires.

25. Apparatus for practicing the process of manufacturing fine powders, comprising means for providing melted material from a source of melted material, means for generating a pulsed plasma jet, means for directing the pulsed plasma jet to impact the melted material, means for atomizing the material into particles, and means for collecting powder formed from the particles.

26. The apparatus of claim 25, wherein the means for providing melted material comprises means for releasing a melt stream, wherein the means for generating the pulsed plasma jet further comprises means for generating multiple pulsed plasma jets and the means for directing comprises means for directing the multiple pulsed plasma jets to the melt stream, and further comprising means for controlling the plasma jets for atomizing the melted material.

27. Apparatus for practicing the process of manufacturing fine powders, comprising means for supplying melted material, means for repetitively pulsing a plasma jet generator, means for repetitively generating pulsed plasma jets, means for directing the pulsed plasma jets to the melted material, means for impacting the melted material with the pulsed plasma jets, means for atomizing the melted material into particles, means for solidifying the particles into powder, and means for collecting the powder in a chamber.

28. The apparatus of claim 27, wherein the means for supplying melted material comprises means for feeding wires toward a gap in front of the pulsed plasma jets, means for igniting a spark across the gap and means for melting material on the wires.

29. The method of claim 27, wherein the means for repetitively generating pulsed plasma jets further comprises means for supplying liquid material to the pulsed plasma jet generator, means for repetitively gasifying the liquid material in the plasma jet generator, and means for repetitively igniting a spark between electrodes in the plasma jet generator, means for producing a plasma, and means for expelling the plasma in pulsed plasma jets from the generator.

30. Apparatus for producing fine metal powders comprising a source of molten metal, a stream former for forming a stream of molten metal, repetitively pulsed plasma jets directed to the melt stream for impacting and atomizing the melt stream into fine droplets, and a collector for collecting fine powders formed from the fine droplets.

31. The apparatus of claim 30, wherein the repetitively pulsed plasma jets comprise high pressure pulsed plasma jets.

32. The apparatus of claim 30, wherein the repetitively pulsed plasma jets are generated by confined capillary arc discharges.

33. The apparatus of claim 32, wherein the repetitively pulsed plasma jets are operated about 10 or more pulses per second, and at capillary pressures of about 1 kilobar, and at capillary temperatures of about 12,000 °K.

\* \* \* \* \*